United States Patent
Tang

(10) Patent No.: US 10,606,387 B2
(45) Date of Patent: Mar. 31, 2020

(54) IN-CELL TOUCH DISPLAY PANEL

(71) Applicant: Wuhan China Star Optoelectronics Technology Co., Ltd., Wuhan, Hubei (CN)

(72) Inventor: Yuejun Tang, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 260 days.

(21) Appl. No.: 15/740,696

(22) PCT Filed: Dec. 12, 2017

(86) PCT No.: PCT/CN2017/115689
§ 371 (c)(1),
(2) Date: Dec. 28, 2017

(87) PCT Pub. No.: WO2019/085163
PCT Pub. Date: May 9, 2019

(65) Prior Publication Data
US 2019/0384433 A1    Dec. 19, 2019

(30) Foreign Application Priority Data
Oct. 31, 2017 (CN) .......................... 2017 1 1048611

(51) Int. Cl.
*G06F 3/041* (2006.01)
*G02F 1/133* (2006.01)
(Continued)

(52) U.S. Cl.
CPC ........ *G06F 3/0412* (2013.01); *G02F 1/13306* (2013.01); *G02F 1/13338* (2013.01);
(Continued)

(58) Field of Classification Search
CPC ......... G06F 3/0412; G06F 2203/04102; G06F 2203/04112; G06F 3/041; G02F 1/13338
See application file for complete search history.

(56) References Cited

U.S. PATENT DOCUMENTS

| 2012/0019461 | A1 | 1/2012 | Chang et al. | |
|---|---|---|---|---|
| 2014/0009400 | A1* | 1/2014 | Poorter | G06F 3/041 345/173 |
| 2016/0132148 | A1* | 5/2016 | Han | G06F 3/044 345/174 |

FOREIGN PATENT DOCUMENTS

| CN | 103558937 A | 2/2014 |
|---|---|---|
| CN | 204595387 U | 8/2015 |

(Continued)

*Primary Examiner* — Gerald Johnson
(74) *Attorney, Agent, or Firm* — Hemisphere Law, PLLC; Zhigang Ma

(57) ABSTRACT

The present invention discloses an in-cell touch display panel. The in-cell touch display panel comprises a TFT array substrate and an opposite substrate. A display circuit and a first bonding area are disposed on the TFT array substrate. A display driver chip provides a display driving signal to the display circuit through the first bonding area. A touch electrode layer and a second bonding area are disposed on the opposite substrate. A touch driver chip provides a touch driving signal to the touch electrode layer through the second bonding area. The in-cell touch display panel provided by the present invention disposes the touch structure and its driver chip on the opposite substrate. Manufacturing of the in-cell touch display panel has become easier. And also reduce the interference of the driving signal generated from the touch structure on the display function of the display panel.

13 Claims, 3 Drawing Sheets

(51) Int. Cl.
*G02F 1/1333* (2006.01)
*H01L 23/00* (2006.01)

(52) U.S. Cl.
CPC ............ *G06F 3/0416* (2013.01); *H01L 24/09* (2013.01); *H01L 2224/091* (2013.01)

(56) References Cited

FOREIGN PATENT DOCUMENTS

| | | |
|---|---|---|
| CN | 105549788 A | 5/2016 |
| CN | 105954952 A | 9/2016 |
| CN | 106847827 A | 6/2017 |

\* cited by examiner

IN-CELL TOUCH DISPLAY PANEL

RELATED APPLICATIONS

The present application is a National Phase of International Application Number PCT/CN2017/115689, filed Dec. 12, 2017, and claims the priority of China Application No. 201711048611.3, filed Oct. 31, 2017.

FIELD OF THE DISCLOSURE

The present invention relates to a display technical field, and particularly to an in-cell touch display panel.

BACKGROUND

With the advent of the explosive growth information and the accelerated pace of life. The touch technology due to its friendly user-interface design and rapid operating with simple key in. The touch panels have gradually replaced the traditional mouse and keyboard, and the touch panels are widely used in many electronic products. In particular, the capacitive touch panel has the advantages of fast response, high sensitivity, good reliability, and high durability, it is widely applied.

According to different installation types of the touch sensing layer on the display panel, the touch display panel can be divided into an Add-on type, an In-cell type and an On-cell type. Among them, the in-cell type is the touch function integrated into the display screen, thereby effectively reducing the overall thickness of the display and simplifying the manufacturing process so as to make the product lighter and thinner. Thus the in-cell type panel and screen has a lower production cost and wider popular.

In the prior art, for the in-cell touch screen, the structure of the touch screen is directly disposed on the array substrate. Thereby, portion of structural in the array substrate are also used to transmit display signals and use as touch electrodes. For example, the data line and the scan line are used as a touch control electrode, or the common electrode layer is used as a touch control electrode. Then these structures can transmit the display signal and the touch signal in time sequence. The above in-cell touch screen structure will be described below. First of all, according to the structure, since the touch electrodes commonly use said structure for transmitting the display signal, the structure of the array substrate is highly integrated and difficult to manufacture. Secondly, due to the high degree of structural integration, the stability of the touch signal is also difficult to control. Therefore, the integrated touch structure severely interferes with the image display performance. In addition, it is explained in terms of driving signals. If use the driving mode according to time sequence, then it will significantly increase the load on the driver chip, and thus significantly increase the cost.

SUMMARY

A technical problem to be solved by the disclosure is to provide an in-cell touch display panel. By improving the touch structure and improve the driver chip set position. Manufacturing of the in-cell touch display panel has become easier. And also reduce the interference of the driving signal generated from the touch structure layer on the display function of the display panel.

An objective of the disclosure is achieved by following embodiments.

An in-cell touch display panel comprises a TFT array substrate and an opposite substrate. The opposite substrate and the TFT array substrate are disposed oppositely. A display circuit and a first bonding area are disposed on the TFT array substrate. The first bonding area electrically connects with a display driver chip. The display driver chip provides a display driving signal to the display circuit through the first bonding area. A touch electrode layer and a second bonding area are disposed on the opposite substrate. The second bonding area electrically connects with a touch driver chip. The touch driver chip provides a touch driving signal to the touch electrode layer through the second bonding area.

Wherein, a display medium and a sealant frame are disposed between the TFT array substrate and the opposite substrate. The sealant frame surrounds the periphery of the display medium. The display circuit is located within the range enclosed by the sealant frame. The first bonding area is located outside the range enclosed by the sealant frame. The touch electrode layer is located within the range enclosed by the sealant frame. The second bonding area is located outside the range enclosed by the sealant frame.

In an embodiment, the in-cell touch display panel is an Organic Light-Emitting Diode (OLED) display panel. The display medium is an organic light emitting layer. The opposite substrate is a package lid.

In an embodiment, the in-cell touch display panel is a liquid crystal display panel. The display medium is a liquid crystal layer. The opposite substrate is a color filter substrate.

In an embodiment, the first bonding area and the second bonding area are located outside the sealant frame and on different sides.

In an embodiment, the first bonding area and the second bonding area are located outside the sealant frame and on the same side. The first bonding area is disposed on the TFT array substrate adjacent to a first end edge. The opposite substrate has a protruding portion extending from above the first end edge of the TFT array substrate. The second bonding area is disposed on the protruding portion.

In an embodiment, the display driver chip is electrically connected to the first bonding area through a first flexible circuit board. The touch driver chip is electrically connected to the second bonding area through a second flexible circuit board.

In an embodiment, the second bonding area is electrically connected to the touch electrode layer by a golden finger.

In an embodiment, the touch electrode layer comprises a driving electrode and a sensing electrode. The driving electrode and the sensing electrode are insulated from each other and disposed in the same structure layer.

In an embodiment, the touch electrode layer comprises a driving electrode and a sensing electrode. The driving electrode and the sensing electrode are insulated from each other and disposed in different structural layers.

The present invention provides embodiments of the in-cell touch display panel. Using the touch structure layer and its related signal bonding area are disposed on the opposite substrate opposite to the array substrate. And using the structures for transmitting the display signal and the touch signal are respectively disposed on different substrates. Not only reduces the difficulty of manufacturing the in-cell touch display panel, but also reduces the interference of the driving signals generated by the touch structure layer to the display functions of the display panel.

DETAILED DESCRIPTION OF PREFERRED EMBODIMENTS

Figure 1:
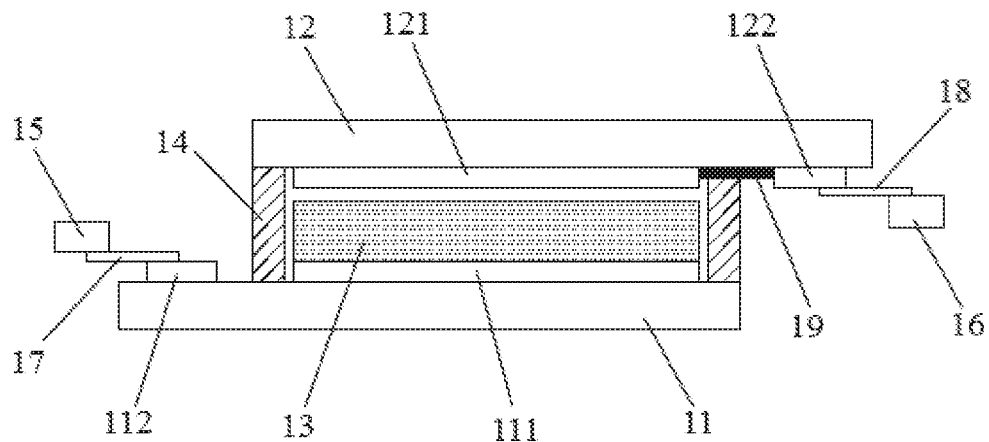
FIG. 1 is a structural schematic view of an in-cell touch display panel according to first embodiment of the present invention.

In order to make the objectives, technical solutions and advantages of the present invention clearer. The specific embodiments of the present invention will be described in detail below with reference to the accompanying drawings. These preferred embodiments are illustrated in the accompanying drawings. However, the embodiments of the present invention shown in the drawings and described in the drawings are merely exemplary, and the present invention is not limited to these embodiments.

It should also be noted that in order to avoid obscuring the present invention by unnecessary details. Only the structures and/or processing steps that are closely related to the present invention are shown in the drawings. Therefore, other details that have little to do with the present invention will be omitted.

Please refer to the first embodiment:

This embodiment provides an in-cell touch display panel, as shown in FIG. 1. The in-cell touch display panel comprises a TFT array substrate 11 and an opposite substrate 12. The opposite substrate 12 and the TFT array substrate 11 are disposed oppositely. A display medium 13 and a sealant frame 14 are disposed between the TFT array substrate 11 and the opposite substrate 12, The sealant frame 14 surrounds the periphery of the display medium 13.

In this embodiment, the in-cell touch display panel is an OLE© (Organic Light-Emitting Diode) display panel. The display medium 13 is an organic light emitting layer. The opposite substrate 12 is a package lid. The sealant frame 14 is the encapsulating glue. The TFT array substrate 11 and the opposite substrate 12 (package lid) form a sealed chamber with surrounding the sealant frame 14. The display medium 13 (organic light emitting structure layer) is disposed in the sealed chamber. The organic light emitting structure layer may include an anode layer, a light emitting material layer and a cathode layer.

Wherein, a display circuit 111 and a first bonding area 112 are disposed on the TFT array substrate 11. The first bonding area 112 electrically connects with a display driver chip 15. The display driver chip 15 provides a display driving signal to the display circuit 111 through the first bonding area 112. A touch electrode layer 121 and a second bonding area 122 are disposed on the opposite substrate 12. The second bonding area 122 electrically connects with a touch driver chip 16. The touch driver chip 16 provides a touch driving signal to the touch electrode layer 121 through the second bonding area 122. Wherein, the display driver chip 15 is electrically connected to the first bonding area 112 through a first flexible circuit board 17, the touch driver chip 16 is electrically connected to the second bonding area 122 through a second flexible circuit board 18. Further described, the connection between the display driver chip 15 and the touch driver chip 16 may be implemented by the connection type of COF (Chip On Film) or COG (Chip On Glass).

Specifically, on the TFT array substrate 11, the display circuit 111 is located within the sealant frame 14. The first bonding area 112 is located outside the range enclosed by the sealant frame 14. The display circuit 111 mainly includes thin film transistors arranged in an array and signal lines such as data lines or gate lines. The first bonding area 112 is electrically connected to the display circuit 111 through a circuit disposed in the TFT array substrate 11. The base-substrate of the TFT array substrate 11 may be a rigid substrate, such as a glass substrate. The base-substrate of the TFT array substrate 11 may also be a flexible substrate, such as Polyimide (PI), Polycarbonate (PC), Poly Ether Sulfone (PES), Polyethylene Terephthalate (PET), Poly Ethylene Naphthalate (PEN), Polyarylate (PAR), or glass fiber reinforced plastic (FRP) and other polymer materials.

Figure 2:
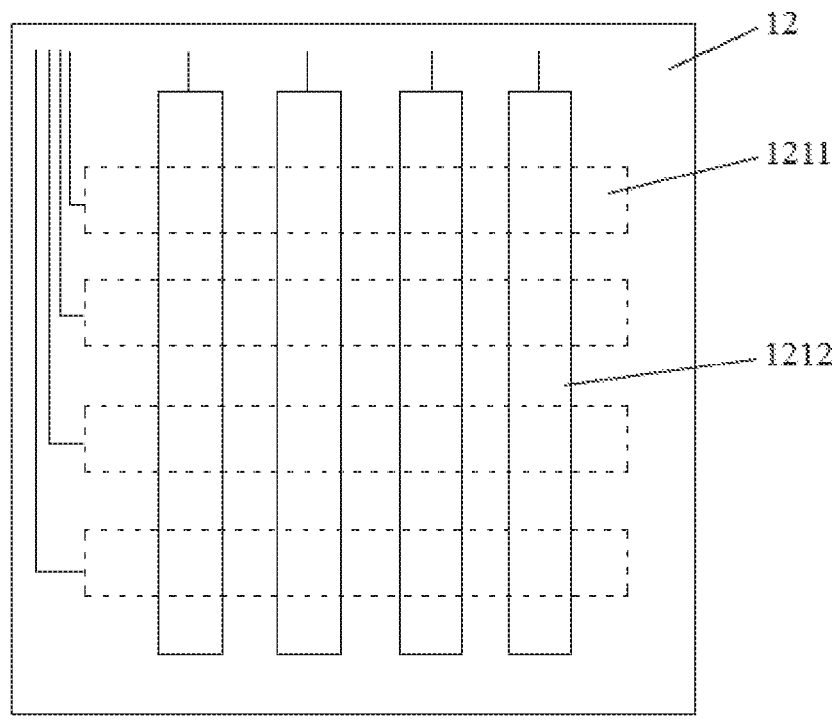
FIG. 2 is a structural schematic view of a touch electrode layer in first embodiment of the present invention.

Specifically, on the opposite substrate 12, the touch electrode layer 121 is located within the range enclosed by the sealant frame 14, and the second bonding area 122 is located outside the range enclosed by the sealant frame 14. As shown in FIG. 2, the touch electrode layer 121 includes a driving electrode 1211 and a sensing electrode 1212 that are insulated from each other. In this embodiment, the driving electrode 1211 and the sensing electrode 1212 are disposed in different structural layers. As indicated by a dotted line in FIG. 2, the driving electrode 1211 is located relatively below the sensing electrode 1212. An insulating layer (not shown) is disposed between the driving electrode 1211 and the sensing electrode 1212. Each driving electrode 1211 and each sensing electrode 1212 are respectively connected with a signal line. It should be noted that only a part of the driving electrodes 1211 and a part of sensing electrodes 1212 are exemplarily shown in FIG. 2. The arrangement and structure of the touch electrode layer 121 are not limited to those shown in FIG. 2.

Wherein, the second bonding area 122 is electrically connected to the touch electrode layer 121 by a golden finger 19. Specifically, each of the driving electrodes 1211 and each of the sensing electrodes 1212 in the touch electrode layer 121 are electrically connected to the second bonding area 122 through the golden finger 19. So as to establish signal communication with the touch driver chip 16.

In a more preferred embodiment, the first bonding area 112 and the second bonding area 122 are located outside the sealant frame 14 and on different sides. For example, as shown in FIG. 1 the first bonding area 112 is located on the TFT array substrate 11 and is located on the left side of the sealant frame 14. And the second bonding area 122 is located on the opposite substrate 12 and is located on the right side of the sealant frame 14. The first bonding area 112 and the second bonding area 122 are disposed on different outer sides of the sealant frame 14. There is an advantage of effectively utilizing the space of the bezel area of the display panel.

Figure 3:
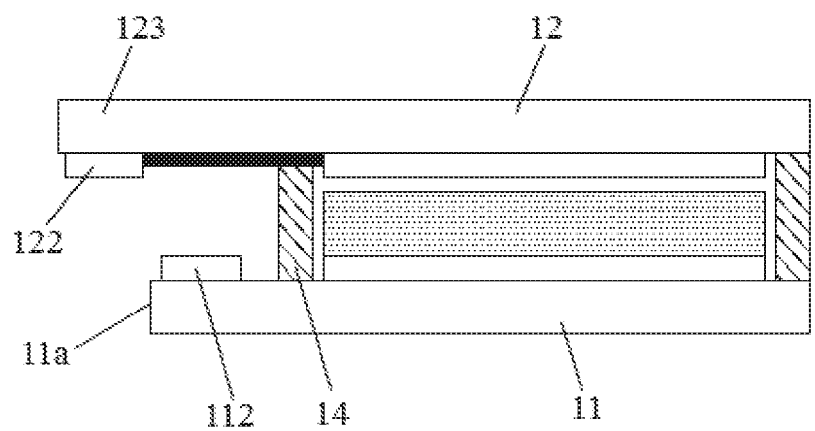
FIG. 3 is a schematic view of the installation location of a second bonding area in first embodiment of the present invention.

In another specific embodiment, the first bonding area 112 and the second bonding area 122 may be located outside the sealant frame 14 and on the same side. Specifically, as shown in FIG. 3, the first bonding area 112 is disposed on the TFT array substrate 11 adjacent to a first end edge 11a. The opposite substrate 12 has a protruding portion 123 extending from above the first end edge 11a of the TFT array substrate 11. The second bonding area 122 is disposed on the protruding portion 123. Further described, when the distance between the TFT array substrate 11 and the opposite substrate 12 is small. The best technical solution is to adopt the technical solutions that the first bonding area 112 and the second bonding area 122 are disposed on different outer sides of the sealant frame 14 (for example, corresponding to the technical solution in FIG. 1). In order to avoid connecting too many driver chips or other components interfere with each other in a small space.

As the in-cell touch OLED display panel referred by the above embodiment, when the touch structure layer and the related signal bonding area are disposed on the package lid opposite to the array substrate, and the structural for transmitting the display signal and the touch signal are separately disposed on different substrates, will generate the following advantages. Not only reduces the difficulty of manufacturing the in-cell touch display panel but also reduces the interference of the touch structure layer and the related driving signals to the display function of the display panel.

Figure 4:
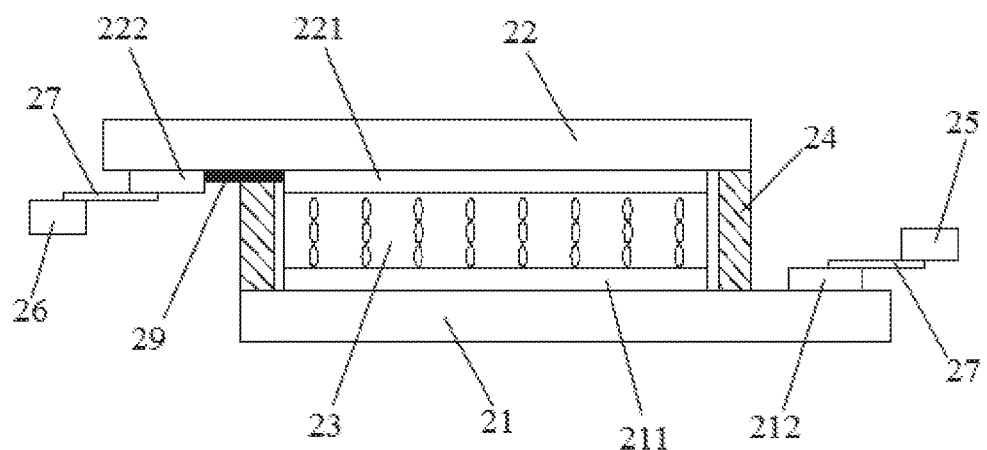
FIG. 4 is a structural schematic view of an in-cell touch display panel according to a second embodiment of the present invention.

Please refer to the second embodiment:

This embodiment provides an in-cell touch display panel, as shown in FIG. 4. The in-cell touch display panel comprises a TFT array substrate 21 and an opposite substrate 22. The opposite substrate 22 and the TFT array substrate 21 are disposed oppositely. A display medium 23 and a sealant frame 24 are disposed between the TFT array substrate 21 and the opposite substrate 22. The sealant frame 24 surrounds the periphery of the display medium 23.

In this embodiment, the in-cell touch display panel is a liquid crystal display (LCD) panel. The display medium 23 is a liquid crystal layer. The opposite substrate 22 is a color filter substrate. The sealant frame 24 is the sealant. The TFT array substrate 21 and the opposite substrate 22 (color filter substrate) form a sealed chamber with surrounding the sealant frame 24. The display medium 23 (liquid crystal layer) is disposed in the sealed chamber.

Wherein, a display circuit 211 and a first bonding area 212 are disposed on the TFT array substrate 21. The first bonding area 212 electrically connects with a display driver chip 25. The display driver chip 25 provides a display driving signal to the display circuit 211 through the first bonding area 212. A touch electrode layer 221 and a second bonding area 222 are disposed on the opposite substrate 22. The second bonding area 222 electrically connects with a touch driver chip 26. The touch driver chip 26 provides a touch driving signal to the touch electrode layer 221 through the second bonding area 222. Wherein, the display driver chip 25 is electrically connected to the first bonding area 212 through a first flexible circuit board 27, the touch driver chip 26 is electrically connected to the second bonding area 222 through a second flexible circuit board 28. Further described, the connection between the display driver chip 25 and the touch driver chip 26 may be implemented by the connection type of COF (Chip On Film) or COG (Chip On Glass).

Specifically, on the TFT array substrate 21, the display circuit 211 is located within the range enclosed by the sealant frame 24. The first bonding area 212 is located outside the range enclosed by the sealant frame 24. The display circuit 211 mainly includes thin film transistors arranged in an array and includes signal lines such as data lines or gate lines. The first bonding area 212 is electrically connected to the display circuit 211 through a circuit disposed in the TFT array substrate 21. The base-substrate of the TFT array substrate 21 may be a rigid substrate, such as a glass substrate.

Specifically, on the opposite substrate 22, the touch electrode layer 221 is located within the range enclosed by the sealant frame 24, and the second bonding area 222 is located outside the range enclosed by the sealant frame 24. Wherein, the structure of the touch electrode layer 221 can be achieved by referring to the first embodiment.

Further, in the present embodiment, the opposite substrate 22 is the color filter substrate. Therefore, a black matrix, a color resist layer, a flat layer and the like are further provided on the opposite substrate 22. The touch electrode layer 221 may be disposed on the top above the opposite substrate 22, or may be disposed between other two above-mentioned structure layers.

Wherein, the second bonding area 222 is electrically connected to the touch electrode layer 221 by a golden finger 29. Specifically, each of the driving electrodes 2211 and each of the sensing electrodes 2212 in the touch electrode layer 221 are electrically connected to the second bonding area 222 through the golden finger 29. So as to establish signal communication with the touch driver chip 26.

In a more preferred embodiment, the first bonding area 212 and the second bonding area 222 are located outside the sealant frame 24 and on different sides. For example, as shown in FIG. 4, the first bonding area 212 is located on the TFT array substrate 21 and is located on the right side of the sealant frame 24. And the second bonding area 222 is located on the opposite substrate 22 and is located on the left side of the sealant frame 24. The first bonding area 212 and the second bonding area 222 are disposed on different outer sides of the sealant frame 24. There is an advantage of effectively utilizing the space of the bezel area of the display panel.

Figure 5:
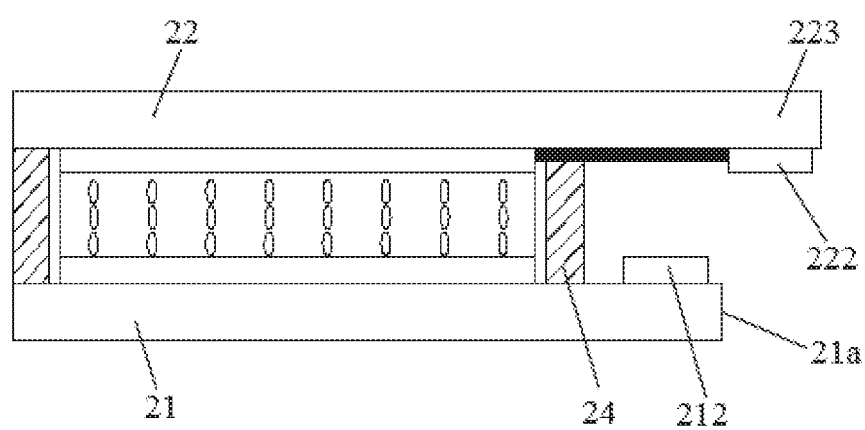
FIG. 5 is a schematic view of the installation position of the second bonding area in second embodiment of the present invention.

In another specific embodiment, the first bonding area 212 and the second bonding area 222 may be located outside the sealant frame 24 and on the same side. Specifically, as shown in FIG. 5, the first bonding area 212 is disposed on the TFT array substrate 21 adjacent to a first end edge 21a. The opposite substrate 22 has a protruding portion 223 extending from above the first end edge 21a of the TFT array substrate 21. The second bonding area 222 is disposed on the protruding portion 223. Further described, when the distance between the TFT array substrate 21 and the opposite substrate 22 is small. The best technical solution is to adopt the technical solutions that the first bonding area 212 and the second bonding area 222 are disposed on different outer sides of the sealant frame 24 (for example, corresponding to the technical solution in FIG. 4). In order to avoid connecting too many driver chips or other components interfere with each other in a small space.

As the in-cell touch liquid crystal display panel referred by the above embodiment, when the touch structure layer and the related signal bonding area are disposed on the color filter substrate opposite to the array substrate, and the structural for transmitting the display signal and the touch signal are separately disposed on different substrates, will generate the following advantages, Not only reduces the difficulty of manufacturing the in-cell touch display panel but also reduces the interference of the touch structure layer and the related driving signals to the display function of the display panel.

In the description of the disclosure, terms such as "first" and "second" are merely for the purpose to distinguish one entity or operation from another entity or operation and cannot requiring or implying any actual relationship between the entities or operations or order. In addition, the term "include" and "comprise" and any variations thereof are meant to cover a non-exclusive inclusion. Such that the process, method, article or device including a series of elements includes not only those elements but also other elements not expressly listed or elements inherent to such process, method, article or device. Without further limitations, an element limited by the statement "including a . . . " does not exclude the existence of additional identical elements in the process, method, article, or apparatus that includes the element.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. An in-cell touch display panel, comprising:
a TFT array substrate; and
an opposite substrate, the opposite substrate and the TFT array substrate disposed oppositely;
wherein a display circuit and a first bonding area are disposed on the TFT array substrate, the first bonding area electrically connects with a display driver chip, the display driver chip provides a display driving signal to the display circuit through the first bonding area;
wherein a touch electrode layer and a second bonding area are disposed on the opposite substrate, the second bonding area electrically connects with a touch driver chip, the touch driver chip provides a touch driving signal to the touch electrode layer through the second bonding area;
wherein a display medium and a sealant frame are disposed between the TFT array substrate and the opposite substrate, the sealant frame surrounds the periphery of the display medium;
wherein the first bonding area and the second bonding area are located outside the sealant frame and respectively on opposite sides.

2. The in-cell touch display panel according to claim 1, wherein the display circuit is located within the range enclosed by the sealant frame, the first bonding area is located outside the range enclosed by the sealant frame, the touch electrode layer is located within the range enclosed by the sealant frame, and the second bonding area is located outside the range enclosed by the sealant frame.

3. The in-cell touch display panel according to claim 2, wherein the in-cell touch display panel is an Organic Light-Emitting Diode (OLED) display panel, the display medium is an organic light emitting layer, the opposite substrate is a package lid.

4. The in-cell touch display panel according to claim 3, wherein the display driver chip is electrically connected to the first bonding area through a first flexible circuit board, the touch driver chip is electrically connected to the second bonding area through a second flexible circuit board.

5. The in-cell touch display panel according to claim 3, wherein the second bonding area is electrically connected to the touch electrode layer by a golden finger.

6. The in-cell touch display panel according to claim 3, wherein the touch electrode layer comprises a driving electrode and a sensing electrode, the driving electrode and the sensing electrode are insulated from each other and disposed in the same structure layer.

7. The in-cell touch display panel according to claim 3, wherein the touch electrode layer comprises a driving electrode and a sensing electrode, the driving electrode and the sensing electrode are insulated from each other and disposed in different structural layers.

8. An in-cell touch display panel comprising a TFT array substrate and an opposite substrate, and then the opposite substrate and the TFT array substrate disposed oppositely;
wherein a display circuit and a first bonding area are disposed on the TFT array substrate, the first bonding area electrically connects with a display driver chip, the display driver chip provides a display driving signal to the display circuit through the first bonding area;
wherein a touch electrode layer and a second bonding area are disposed on the opposite substrate, the second bonding area electrically connects with a touch driver chip, the touch driver chip provides a touch driving signal to the touch electrode layer through the second bonding area;
wherein the in-cell touch display panel is a liquid crystal display panel, a display medium is disposed between the TFT array substrate and the opposite substrate, the display medium is a liquid crystal layer, the opposite substrate is a color filter substrate;
wherein a sealant frame are disposed between the TFT array substrate and the opposite substrate, the sealant frame surrounds the periphery of the display medium;
wherein the first bonding area and the second bonding area are located outside the sealant frame and respectively on opposite sides.

9. The in-cell touch display panel according to claim 8, wherein the display circuit is located within the range enclosed by the sealant frame, the first bonding area is located outside the range enclosed by the sealant frame, the touch electrode layer is located within the range enclosed by the sealant frame, and the second bonding area is located outside the range enclosed by the sealant frame.

10. The in-cell touch display panel according to claim 9, wherein the display driver chip is electrically connected to the first bonding area through a first flexible circuit board, the touch driver chip is electrically connected to the second bonding area through a second flexible circuit board.

11. The in-cell touch display panel according to claim 9, wherein the second bonding area is electrically connected to the touch electrode layer by a golden finger.

12. The in-cell touch display panel according to claim 9, wherein the touch electrode layer comprises a driving electrode and a sensing electrode, the driving electrode and the sensing electrode are insulated from each other and disposed in the same structure layer.

13. The in-cell touch display panel according to claim 9, wherein the touch electrode layer comprises a driving electrode and a sensing electrode, the driving electrode and the sensing electrode are insulated from each other and disposed in different structural layers.

* * * * *